United States Patent
Chen

(10) Patent No.: US 8,269,310 B2
(45) Date of Patent: Sep. 18, 2012

(54) STORAGE CAPACITOR HAVING AN INCREASED APERTURE RATIO AND METHOD OF MANUFACTURING THE SAME

(75) Inventor: Chiu-Chuan Chen, Shen-zhen (CN)

(73) Assignee: Century Display (Shenzhen) Co., Ltd., Long-Hua, Bao'an Shen-Zhen (CN)

( * ) Notice: Subject to any disclaimer, the term of this patent is extended or adjusted under 35 U.S.C. 154(b) by 254 days.

(21) Appl. No.: 12/466,675

(22) Filed: May 15, 2009

(65) Prior Publication Data

US 2010/0176485 A1    Jul. 15, 2010

(30) Foreign Application Priority Data

Jan. 9, 2009  (CN) .......................... 2009 1 0036561

(51) Int. Cl.
*H01L 21/02* (2006.01)

(52) U.S. Cl. ............... 257/532; 257/80; 257/82; 257/91; 257/304; 257/328; 257/298; 257/350; 257/535; 257/311; 257/516

(58) Field of Classification Search ................... 257/532, 257/80, 82–84, 91, 98, 304, 328, 350, 535, 257/298, 311, 516

See application file for complete search history.

(56) References Cited

U.S. PATENT DOCUMENTS

| | | | | |
|---|---|---|---|---|
| 4,291,321 A * | 9/1981 | Pfleiderer et al. | ............. | 257/336 |
| 4,300,150 A * | 11/1981 | Colak | ........................... | 257/336 |
| 5,146,291 A * | 9/1992 | Watabe et al. | ................. | 257/344 |
| 5,156,986 A * | 10/1992 | Wei et al. | ....................... | 438/159 |
| 5,214,304 A * | 5/1993 | Ema et al. | ...................... | 257/412 |
| 5,217,913 A * | 6/1993 | Watabe et al. | ................. | 438/304 |
| 5,254,867 A * | 10/1993 | Fukuda et al. | ................. | 257/411 |
| 5,409,848 A * | 4/1995 | Han et al. | ....................... | 438/302 |
| 5,473,184 A * | 12/1995 | Murai | ........................... | 257/382 |
| 5,532,508 A * | 7/1996 | Kaneko et al. | ................. | 257/336 |
| 5,719,425 A * | 2/1998 | Akram et al. | .................. | 257/344 |
| 5,763,916 A * | 6/1998 | Gonzalez et al. | .............. | 257/345 |
| 5,801,416 A * | 9/1998 | Choi et al. | ..................... | 257/335 |
| 6,046,472 A * | 4/2000 | Ahmad et al. | ................. | 257/336 |
| 6,093,948 A * | 7/2000 | Zambrano et al. | ............. | 257/339 |
| 6,118,506 A * | 9/2000 | Yamazaki et al. | ............. | 349/111 |
| 6,198,131 B1 * | 3/2001 | Tung | .............................. | 257/345 |
| 6,215,163 B1 * | 4/2001 | Hori et al. | ...................... | 257/411 |
| 6,232,191 B1 * | 5/2001 | Jeng et al. | ...................... | 438/303 |
| 6,235,559 B1 * | 5/2001 | Kuo | ............................... | 438/149 |

(Continued)

*Primary Examiner* — Fernando L Toledo
*Assistant Examiner* — Mohammed Shamsuzzaman
(74) *Attorney, Agent, or Firm* — Muncy, Geissler, Olds & Lowe, PLLC

(57) ABSTRACT

Disclosed is a method of manufacturing a storage capacitor having increased aperture ratio: providing a substrate having a metal layer disposed thereon, and said metal layer is covered correspondingly with a first dielectric layer and a second dielectric layer in sequence; forming a photoresist layer with a uniform thickness to cover said second dielectric layer; performing a process of exposure-to-light and development to a portion of said photoresist layer that is correspondingly disposed over said metal layer sequentially, so that its thickness is less than its original thickness; removing said photoresist layer and etching said portion of said second dielectric layer, so that a thickness of said portion of said second dielectric layer is less than its original thickness, and the etching depth of said portion is greater than that of the other remaining portions of said second dielectric layer; and forming an electrode layer on said second dielectric layer.

5 Claims, 8 Drawing Sheets

U.S. PATENT DOCUMENTS

| | | | | |
|---|---|---|---|---|
| 6,236,085 | B1* | 5/2001 | Kawaguchi et al. | 257/345 |
| 6,281,062 | B1* | 8/2001 | Sanchez | 438/217 |
| 6,316,297 | B1* | 11/2001 | Matsuda | 438/174 |
| 6,362,028 | B1* | 3/2002 | Chen et al. | 438/149 |
| 6,424,397 | B1* | 7/2002 | Kuo | 349/139 |
| 6,501,128 | B1* | 12/2002 | Otsuki | 257/330 |
| 6,661,096 | B1* | 12/2003 | Takayama et al. | 257/763 |
| 6,777,749 | B2* | 8/2004 | Rumennik et al. | 257/343 |
| 6,864,134 | B1* | 3/2005 | Satou et al. | 438/197 |
| 6,872,975 | B2* | 3/2005 | Murade | 257/59 |
| 7,011,998 | B1* | 3/2006 | Ju et al. | 438/197 |
| 7,129,105 | B2* | 10/2006 | Yoon et al. | 438/30 |
| 7,378,323 | B2* | 5/2008 | Chen | 438/303 |
| 7,514,747 | B2* | 4/2009 | Fukuda | 257/347 |
| 7,514,749 | B2* | 4/2009 | Kato et al. | 257/360 |
| 7,554,619 | B2* | 6/2009 | Lee et al. | 349/39 |
| 7,554,634 | B2* | 6/2009 | Masutani et al. | 349/114 |
| 7,619,256 | B2* | 11/2009 | Hirabayashi et al. | 257/72 |
| 7,619,710 | B2* | 11/2009 | Nishida et al. | 349/141 |
| 7,678,619 | B2* | 3/2010 | Lee | 438/129 |
| 7,785,672 | B2* | 8/2010 | Choi et al. | 427/569 |
| 2002/0172071 | A1* | 11/2002 | Feurle et al. | 365/149 |
| 2003/0022445 | A1* | 1/2003 | Taniguchi et al. | 438/257 |
| 2003/0075733 | A1* | 4/2003 | Yamazaki et al. | 257/200 |
| 2004/0041187 | A1* | 3/2004 | Chiu et al. | 257/296 |
| 2004/0197971 | A1* | 10/2004 | Yamazaki et al. | 438/164 |
| 2005/0037533 | A1* | 2/2005 | Peng et al. | 438/78 |
| 2005/0185109 | A1* | 8/2005 | Rho et al. | 349/44 |
| 2005/0189578 | A1* | 9/2005 | Seo et al. | 257/306 |
| 2005/0236625 | A1* | 10/2005 | Schuele et al. | 257/67 |
| 2005/0255257 | A1* | 11/2005 | Choi et al. | 427/585 |
| 2006/0017103 | A1* | 1/2006 | Szelag | 257/335 |
| 2006/0133146 | A1* | 6/2006 | Maekawa et al. | 365/185.14 |
| 2006/0138568 | A1* | 6/2006 | Taniguchi et al. | 257/408 |
| 2007/0040951 | A1* | 2/2007 | Lee et al. | 349/38 |
| 2007/0042537 | A1* | 2/2007 | Lee | 438/158 |
| 2007/0048910 | A1* | 3/2007 | Yoon et al. | 438/149 |
| 2007/0120194 | A1* | 5/2007 | Shiraishi et al. | 257/368 |
| 2007/0126943 | A1* | 6/2007 | Lee et al. | 349/39 |
| 2007/0284585 | A1* | 12/2007 | Cho et al. | 257/72 |
| 2008/0044963 | A1* | 2/2008 | Cho et al. | 438/160 |
| 2008/0099766 | A1* | 5/2008 | Fang et al. | 257/72 |
| 2008/0180974 | A1* | 7/2008 | Shiraishi et al. | 363/24 |
| 2008/0220580 | A1* | 9/2008 | Kato et al. | 438/275 |
| 2008/0258146 | A1* | 10/2008 | Lin | 257/57 |
| 2008/0258236 | A1* | 10/2008 | Yasuoka et al. | 257/392 |
| 2009/0115029 | A1* | 5/2009 | Koyama et al. | 257/632 |
| 2009/0167975 | A1* | 7/2009 | Lee et al. | 349/43 |
| 2009/0224250 | A1* | 9/2009 | Kisdarjono et al. | 257/66 |
| 2009/0224318 | A1* | 9/2009 | Hatori et al. | 257/339 |
| 2010/0079843 | A1* | 4/2010 | Derichs et al. | 359/259 |
| 2010/0134740 | A1* | 6/2010 | Nakao | 349/138 |
| 2010/0224880 | A1* | 9/2010 | Kimura | 257/59 |
| 2011/0090207 | A1* | 4/2011 | Yamazaki et al. | 345/211 |
| 2011/0114942 | A1* | 5/2011 | Akimoto et al. | 257/43 |
| 2011/0157010 | A1* | 6/2011 | Kothari et al. | 345/156 |
| 2011/0235155 | A1* | 9/2011 | Tao et al. | 359/290 |
| 2012/0120081 | A1* | 5/2012 | Bita et al. | 345/520 |

* cited by examiner

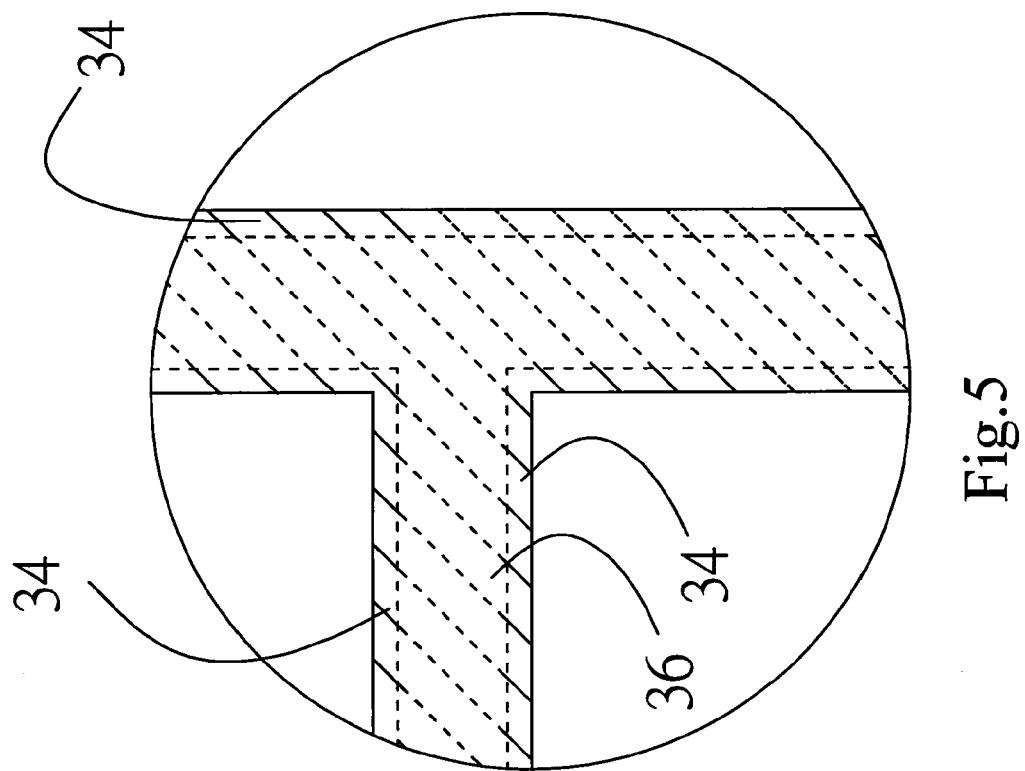
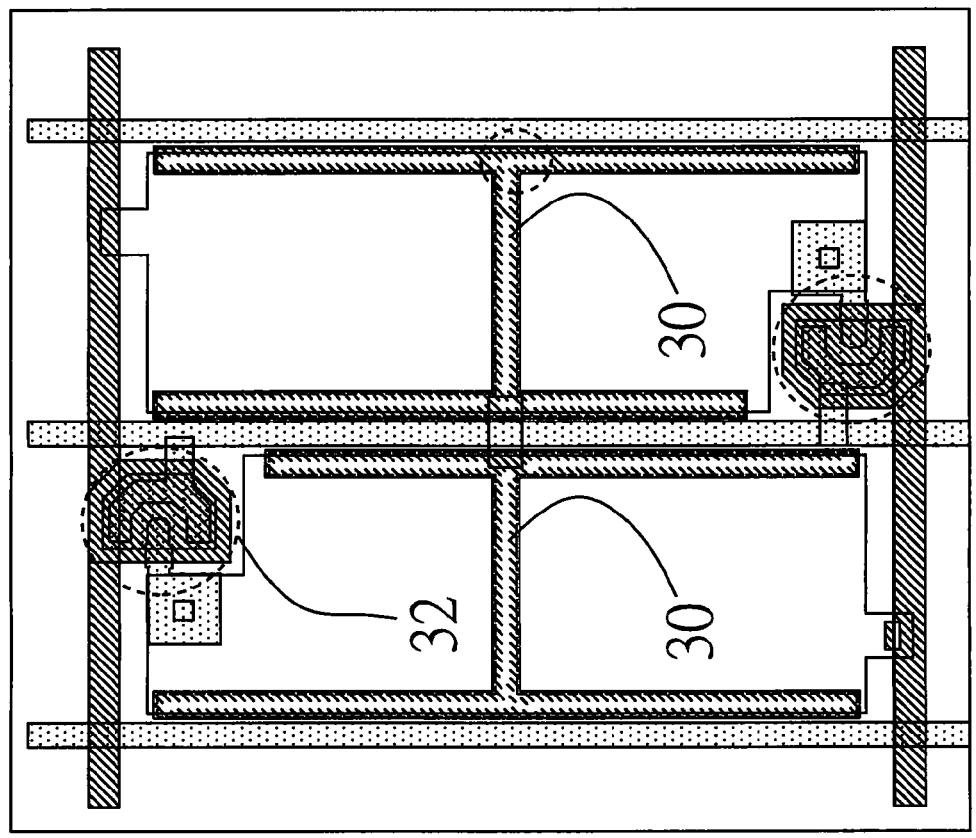
Fig.5
Fig.4

STORAGE CAPACITOR HAVING AN INCREASED APERTURE RATIO AND METHOD OF MANUFACTURING THE SAME

BACKGROUND OF THE INVENTION

1. Field of the Invention

The present invention relates to a technology for manufacturing an array substrate of a liquid crystal display, and in particular to a storage capacitor having an increased aperture ratio and method of manufacturing the same.

2. The Prior Arts

In an active matrix liquid crystal display (LCD), each pixel is provided with a thin-film-transistor (TFT), wherein each TFT includes a gate electrode connected to a scanning line in a horizontal direction, a source electrode connected to a data line in a vertical direction, and a drain electrode connected to a liquid crystal capacitance.

When a thin-film-transistor is turned-on, there will be no current flow through the liquid crystal, and the liquid crystal will react to an electric field caused by the charges accumulated on both sides of liquid crystal, so that the voltage difference between these charges would hereby affect the gray level illuminance of pixels on a panel. Thus, it would be a matter of great importance in stressing the problem of how to reduce the leakage current of liquid crystal capacitance. In order to solve the above-mentioned problem, it is practicable to form a storage capacitor on a glass substrate, which is parallel-connected with the liquid crystal capacitance. In general, the storage capacitor is obtained through a series of procedures that includes forming a metal layer, a first dielectric layer, a second dielectric layer and an electrode layer on a glass substrate, wherein the first dielectric layer, the second dielectric layer and the electrode layer are respectively shared a uniform thickness with other layers of the elements on a substrate.

The application of the storage capacitor may reduce the voltage variations caused by leakage current of liquid crystal capacitance, hereby increasing the capacity of potential-holding. In addition, the application of a storage capacitor may reduce the coupling effects between capacitors as well. From this point of view, the storage capacitor should be designed as large as possible, however, the size of the storage capacitor may not be enlarged without any limits in practice. Since the storage capacitor is made by sandwiching an insulation layer between two metal electrodes, yet since the light can not be transmitted through the metal layer, therefore, once the storage capacitor is designed in a larger scale, the larger area of the light will be shielded by the enlarged area of the storage capacitor, so that the aperture ratio and light transmittance are reduced. However, on the other hand, if an increased aperture ratio is essentially required, the storage capacitor would have to be made smaller, which may further reduce its capability of potential-holding and capacitance coupling effects improvement.

Due to the above-mentioned shortcomings and drawbacks, the present invention discloses a storage capacitor having an increased aperture ratio and a method of manufacturing the same, thus solving the contradiction of the prior art.

SUMMARY OF THE INVENTION

The major objective of the present invention is to provide a storage capacitor having an increased aperture ratio and a method of manufacturing the same. For this purpose, a photoresist layer is coated on a dielectric layer and exposed to light by making use of patterns on a mask, then a developing process and an etching process are carried out in sequence to reduce the thickness of the dielectric layer. Subsequently, an electrode layer is formed on the dielectric layer, hereby providing a storage capacitor. As such, the storage capacitor of the present invention may be able to maintain a sufficient capacitance while reducing the area of an electrode layer as required, and the aperture ratios of the respective pixels on a panel are further raised.

To achieve the above-mentioned objective, the present invention provides a storage capacitor having an increased aperture ratio, including a substrate, a metal layer coating on the substrate, a first dielectric layer and a second dielectric layer sequentially forming on the metal layer, wherein the thickness of the second dielectric layer correspondingly disposed over the metal layer is less than that of the remaining areas of the second dielectric layer. Furthermore, an electrode layer is disposed on the second dielectric layer.

In addition, the present invention also provides a method of manufacturing a storage capacitor having an increased aperture ratio, including the following steps: firstly, providing a substrate having a metal layer disposed thereon; next, forming in sequence a first dielectric layer and a second dielectric layer covering the metal layer; then, forming a photoresist layer with a uniform thickness to cover the second dielectric layer, and through performing a process of exposure-to-light to the photoresist layer correspondingly disposed over the metal layer by utilizing a mask at first and next performing a developing process, the original thickness of the photoresist layer is hereby reduced; subsequently, removing the photoresist layer and portions of second dielectric layer through etching, so that the thickness of the second dielectric layer correspondingly disposed over a metal layer is less than its original thickness, and the etching depth of the portion is greater than that of the other remaining portions of the second dielectric layer, and finally, forming an electrode layer on the second dielectric layer.

Further scope of the applicability of the present invention will become apparent from the detailed description given hereinafter. However, it should be understood that the detailed description and specific examples, while indicating preferred embodiments of the present invention, are given by way of illustration only, since various changes and modifications within the spirit and scope of the present invention will become apparent to those skilled in the art from this detailed description.

BRIEF DESCRIPTION OF THE DRAWINGS

The related drawings in connection with the detailed description of the present invention to be made later are described briefly as follows, in which:

FIG. 4 is a schematic diagram of a circuit layout used for a pixel electrode of an LCD panel according to a first embodiment of the present invention;

FIG. 5 is a partial enlarged view of a storage capacitor in a circuit layout according to a first embodiment of the present invention;

DETAILED DESCRIPTION OF THE PREFERRED EMBODIMENT

The purpose, construction, features, functions and advantages of the present invention can be appreciated and understood more thoroughly through the following detailed description with reference to the attached drawings.

Figure 1:
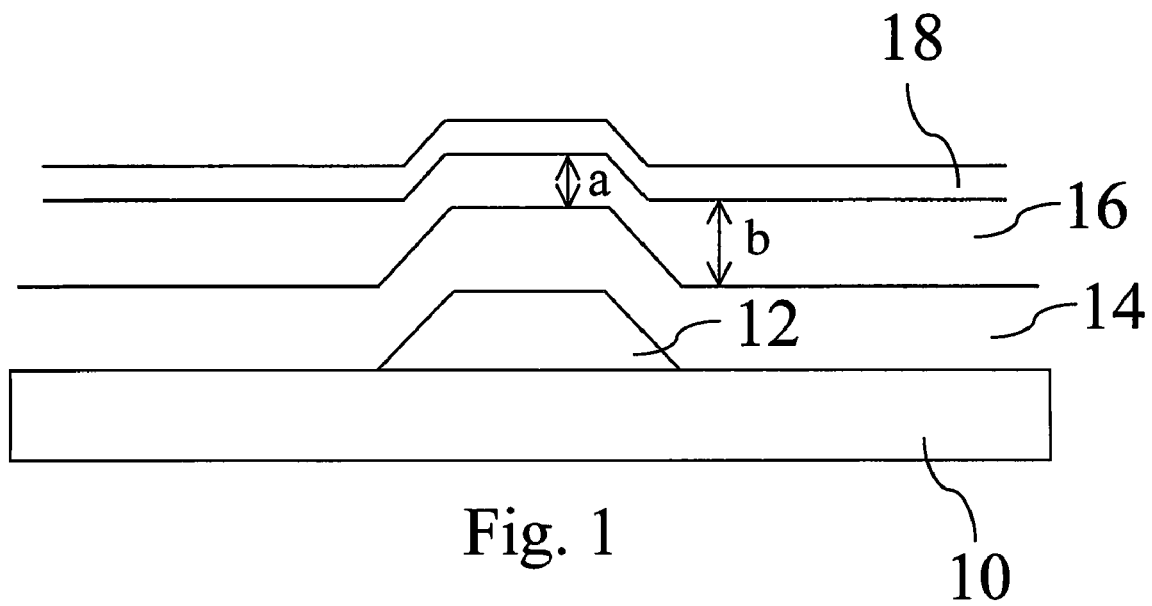
FIG. 1 is a cross section view of a storage capacitor according to the present invention.

In a method of manufacturing a display panel, a thin-film-transistor and a storage capacitor are produced simultaneously during certain specific processes, and a cross section view of the storage capacitor is shown in FIG. 1. As FIG. 1 shows, a storage capacitor of the present invention includes a glass substrate 10, a metal layer 12 coating on the glass substrate 10 as well as a first dielectric layer 14 made of silicon nitride and a second dielectric layer 16, which are sequentially formed on the metal layer 12. In addition, since enough space must be provided for the remaining portions of the second dielectric layer 16, which is other than the portion of the second dielectric layer 16 correspondingly disposed over the metal layer 12, to accommodate the data lines and other components, thus the thicknesses of these remaining portions cannot be reduced too much at will, yet in order to achieve the purpose of reducing the electrode areas of a storage capacitor while still maintaining a sufficient capacitance, it must be aware that the thickness a of the portion of the second dielectric layer 16 correspondingly disposed over the metal layer 12 must be less than the thickness b of the remaining portions of the second dielectric layer 16. Furthermore, a transparent and conductive electrode layer 18 made of indium-tin-oxide (ITO) is formed on the second dielectric layer 16.

Figure 2A:
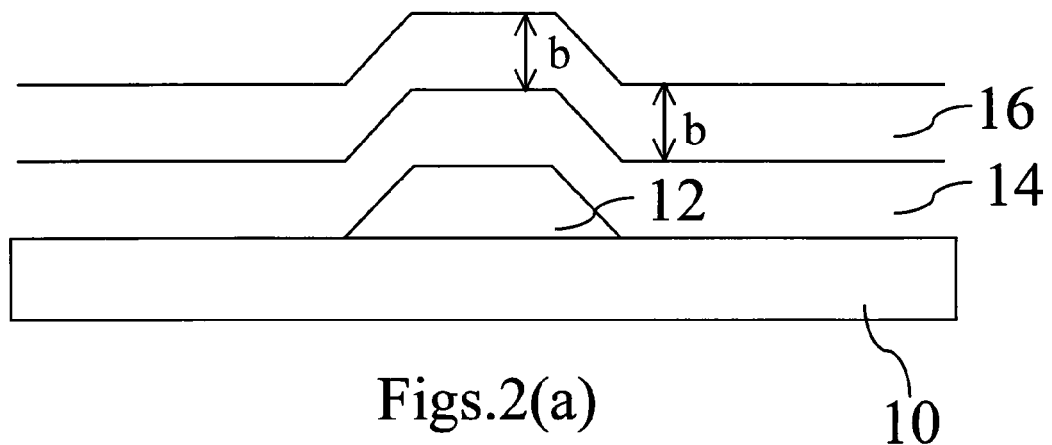
FIGS. 2(a) to 2(f) are cross section views of structures of a storage capacitor corresponding to various steps of the method of the present invention.
Figure 2B:
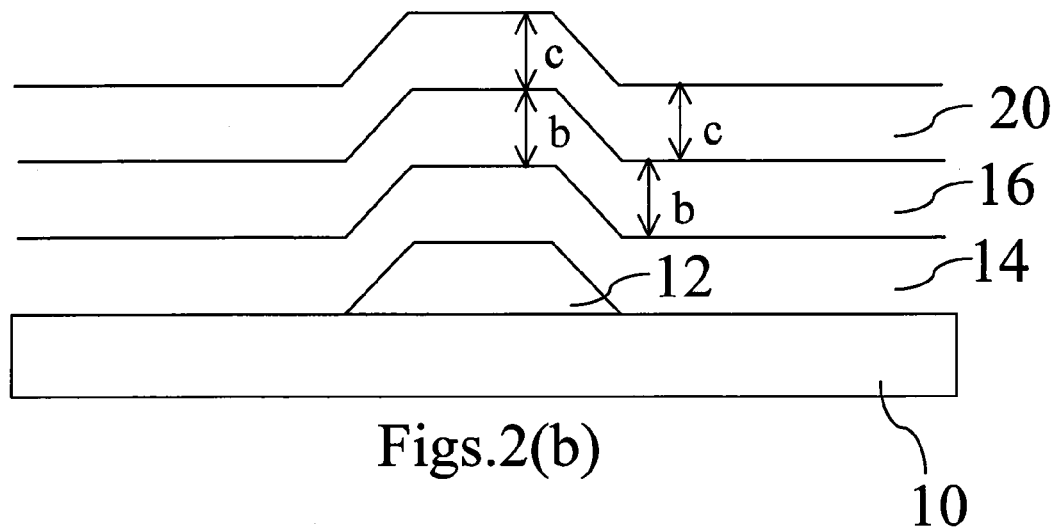
Figure 2C:
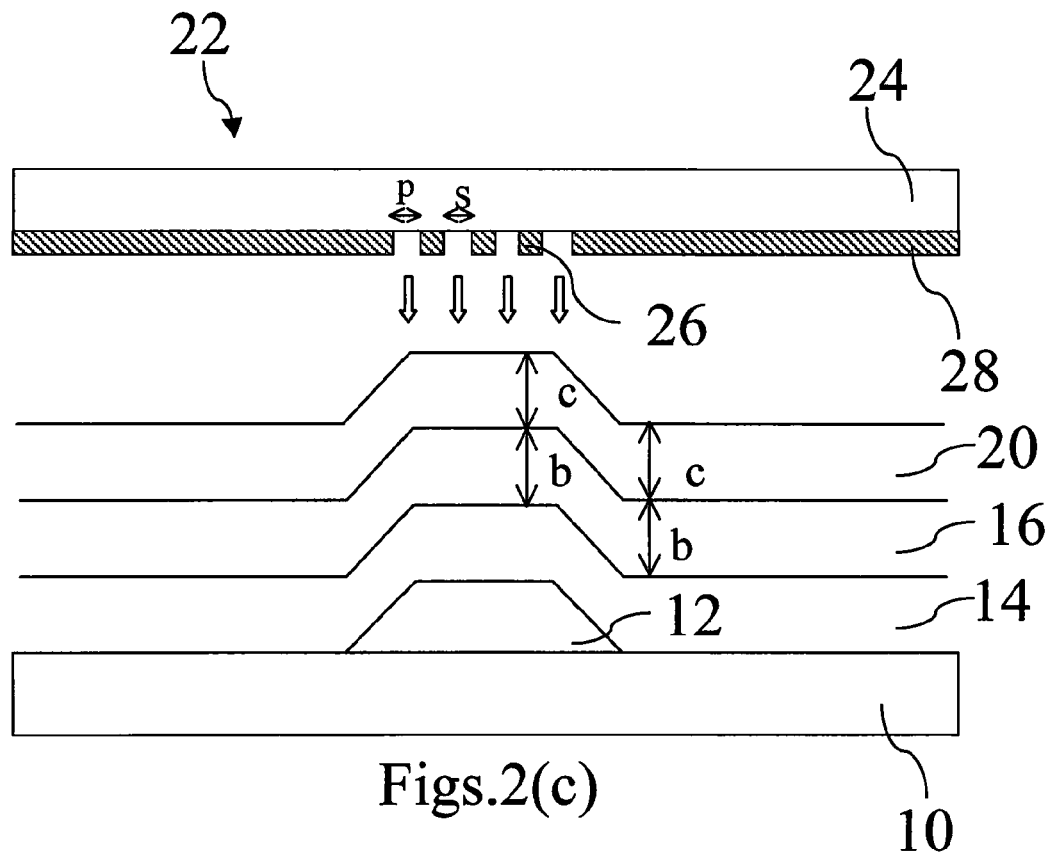
Figure 2D:
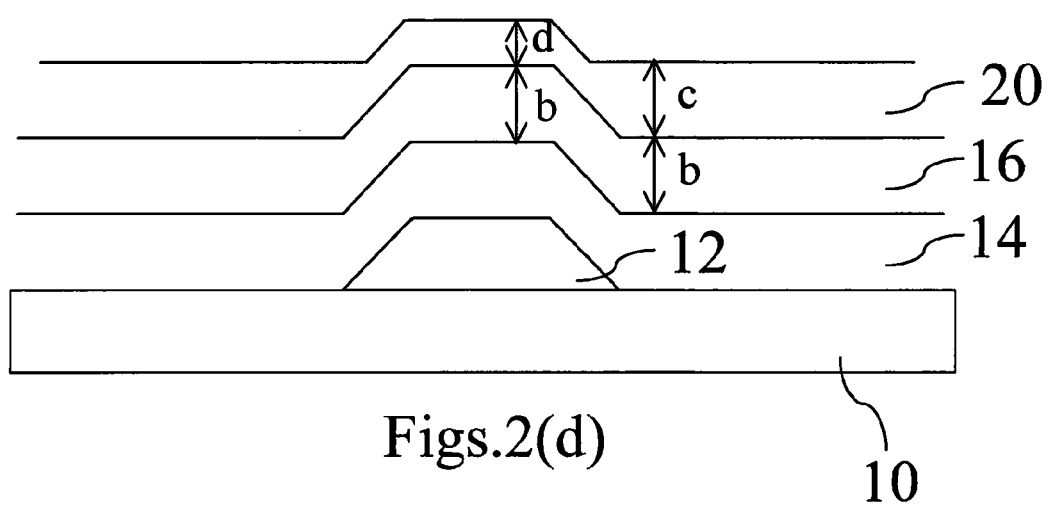

Upon finishing reviewing the preliminary design perspective and the structure of a storage capacitor of the present invention, please continuingly refer to FIGS. 2(a) to 2(f), which show the cross section views of structures of a storage capacitor corresponding to various steps of the method of the present invention. Firstly, as FIG. 2(a) shows, providing a glass substrate 10 having a metal layer 12 disposed thereon, and said metal layer 12 is covered correspondingly with a first dielectric layer 14 and a second dielectric layer 16 sequentially, wherein the second dielectric layer 16 has a thickness b. Next, as shown in FIG. 2(b), forming a photoresist layer 20 with a uniform thickness c on a second dielectric layer 16. Then, as shown in FIG. 2(c), selecting and preparing a mask 22 having a transparent substrate 24, a plurality of opaque first block patterns 26, and an opaque second block pattern 28 in a perimeter of the first block patterns 26, wherein the distance s between the respective first block patterns 26 is ranged from 0 to 4 μm, and the distance p between the second block pattern 28 and the first block patterns nearest to the first block pattern 26 is less than 4 μm, so that the first block patterns 26 and the second block pattern 28 are both located on the transparent substrate 24; then, upon aligning the first block patterns 26 of the mask 22 on the portion of the photoresist layer 20 correspondingly disposed over the metal layer 12, and aligning the second block pattern 28 on the remaining portions of the photoresist layer 20, thus exposing the photoresist layer 20 to light by making use of the mask 22; however, in practical application of exposure-to-light process, the second block pattern 28 would block the light from irradiating the remaining areas of the photoresist layer 20, so that only the portion of the photoresist layer 20 correspondingly disposed over the metal layer 12 are exposed to light. Additionally, since a plurality of less than 4 μm gaps exist between the respective first block patterns 26 and between the first block patterns 26 and the second block pattern 28, so that light may transmit through the above-mentioned gaps in proceeding with light exposure to the portion of the photoresist layer 20 correspondingly disposed over the metal layer 12, meanwhile, when light passes through these gaps less than 4 μm wide, a diffraction phenomenon will appear, so that the energy of the light will reduce after passing through these gaps. Finally, upon finishing exposing to light, proceeding with the development process of photoresist layer 20, and at this time, since the energy of this part of light is decreased, therefore while performing a development process, the portion of the photoresist layer 20 correspondingly disposed over the metal layer 12 is only partially etched, in other words, the portion of the photoresist layer 20 is not etched away in its entirety, such that the thickness d of photoresist layer 20 correspondingly disposed over the metal layer 12 is less than its original thickness c, meanwhile the thickness of the remaining portion of the photoresist layer 20 still remains unchanged as shown in FIG. 2(d).

Figure 2E:
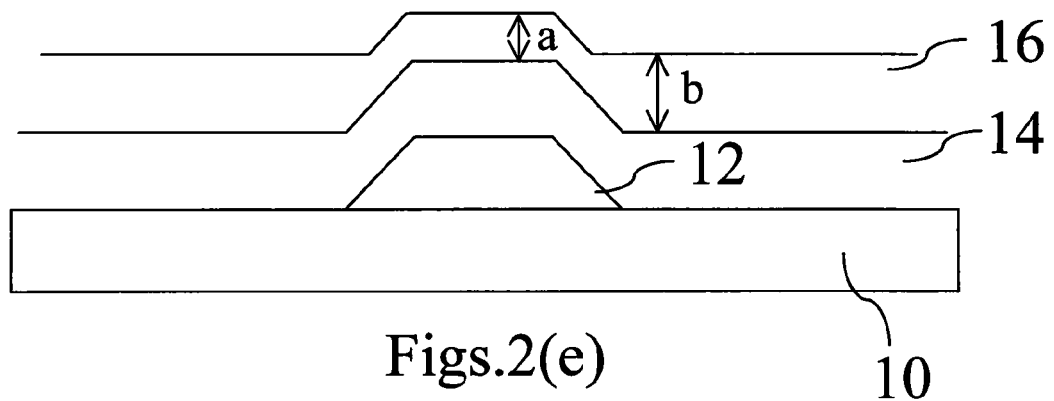
Figure 2F:
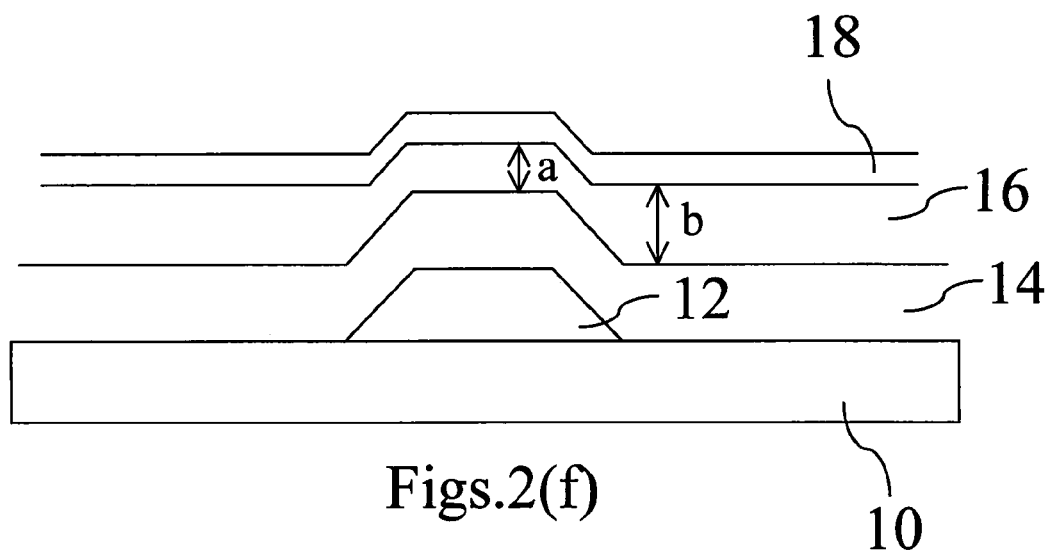

Subsequently, referring to FIG. 2(e) for a cross section view of a structure of storage capacitor corresponding to a step of the method of the present invention. As shown in FIG. 2(e), dry anisotropic etching is utilized to remove the photoresist layer 20 and a part of the second dielectric layer 16. Since different portions of photoresist layer 20 are of different thicknesses, and dry anisotropic etching has the same etching speed for the same material in a specific direction, so that when the portion of photoresist layer 20 of thickness c is entirely etched away, the portion of the second dielectric layer 16 correspondingly disposed over the metal layer 12 is partially etched away. In other words, at this moment, the thickness a of the portion of the second dielectric layer 16 correspondingly disposed over the metal layer 12 is less than the original thickness b, while the thickness of the remaining portions of the second dielectric layer 16 still remains unchanged as b. As a result, whether the etching will be further performed or not, the etching depth of the portion of the second dielectric layer 16 correspondingly disposed over metal layer 12 is greater than the etching depth of the remaining portions of the second dielectric layer 16. Finally, as shown in FIG. 2(f), a transparent conductive electrode layer 18 is formed on the second dielectric layer 16, hereby obtaining a storage capacitor on a glass substrate 10.

Since the second dielectric layer 16 is shared with other layers of the elements on glass substrate 10, therefore, in the present invention, it is only the thickness of the portion of the second dielectric layer 16 correspondingly disposed over the metal layer 12 that is reduced. From a well comprehensive equation $C=(\in \times A)/d$ (wherein, C is a value of capacitance, $\in$ is a dielectric coefficient of a dielectric layer, A is an area of a transparent conductive electrode layer 18, and d is a distance between a transparent conductive electrode layer 18 and a metal layer 12), it is known that when d is reduced, then A is reduced correspondingly, such that C can keep a same capacitance value. As such, through the application of the method of the present invention, the capacitance of a storage capacitor can be maintained, while still achieving the purpose of reducing the area of a transparent conductive electrode layer 18 of a storage capacitor, hereby raising the aperture ratio of the respective pixel of a display panel.

Figure 3:
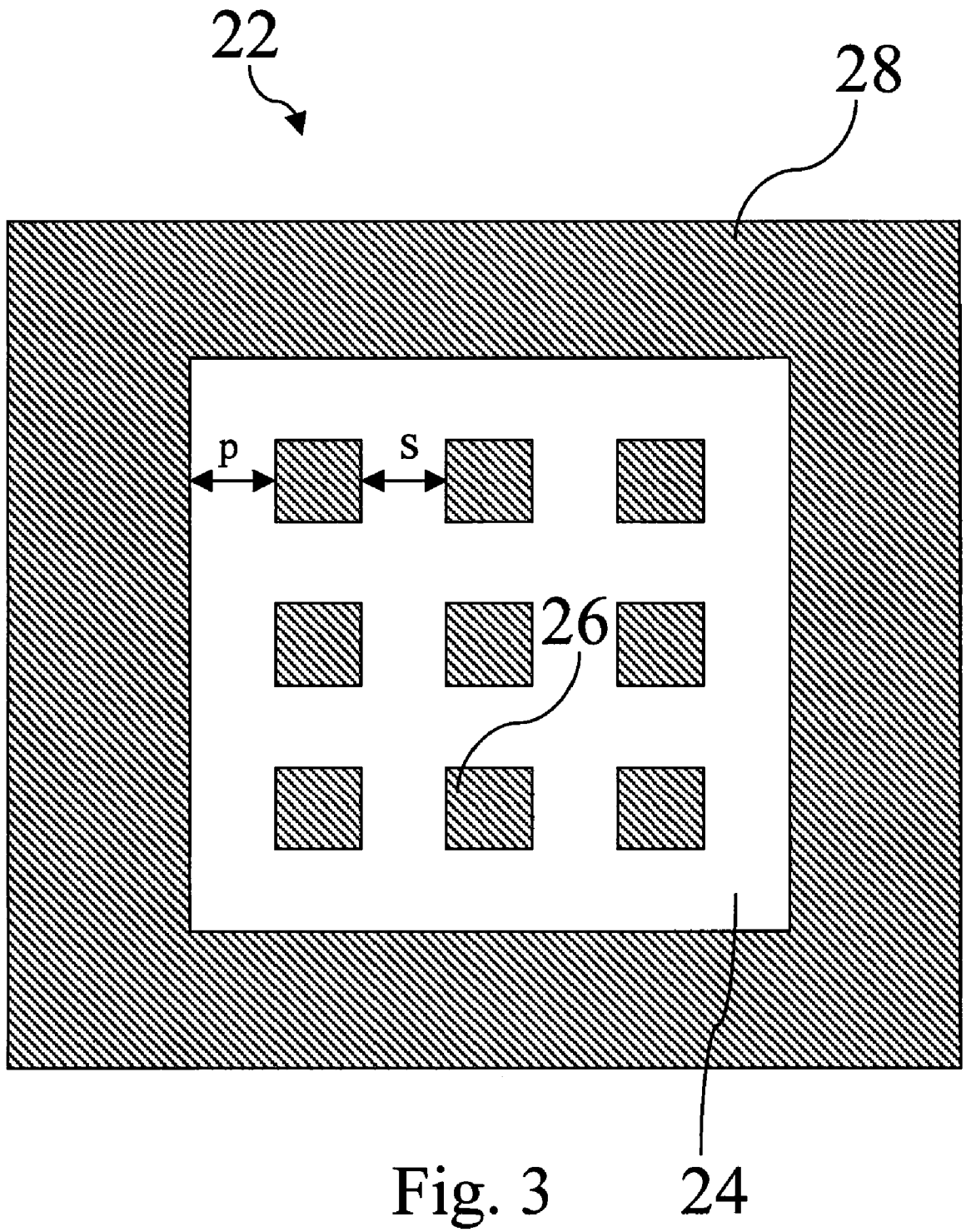
FIG. 3 is a schematic diagram of pattern layout of a mask according to the present invention.

Since in FIG. 2 (c) is shown a cross section of a mask 22, yet its pattern layout can be seen more clearly as shown in FIG. 3. As shown in FIG. 3, a mask 22 is provided with a transparent substrate 24, a plurality of opaque first block patterns 26, and a second block pattern 28 surrounding these first block patterns 26. The first and second block patterns are made of chromium, so that they can be used to expose a specific portion of a photoresist layer to light, while without exposing other portions of a photoresist layer to light.

Subsequently, referring to FIG. 4 for a schematic diagram of a pixel electrode of an LCD panel utilizing a storage capacitor according to a first embodiment of the present invention, wherein, the H-shaped slanted-line portion indicates a storage capacitor 30, which is connected to a thin-film-transistor 32. Furthermore, referring to FIG. 5 for a partial enlarged view of the dotted line circle portion of a storage capacitor as shown in FIG. 4. Wherein, the solid line portion indicates the portion of a removed storage capacitor 34 upon the completion of a storage capacitor through utilizing the present invention, while the dotted line portion indicates the portion of a remaining storage capacitor 36.

Figure 6:
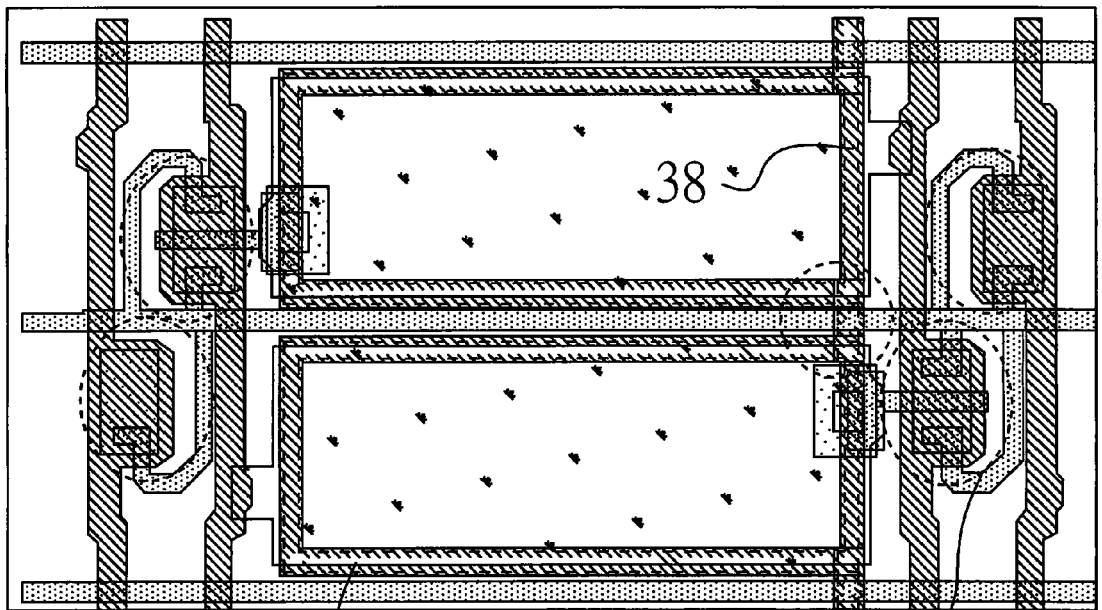
FIG. 6 is a schematic diagram of a circuit layout used for a pixel electrode of an LCD panel according to a second embodiment of the present invention.
Figure 7:
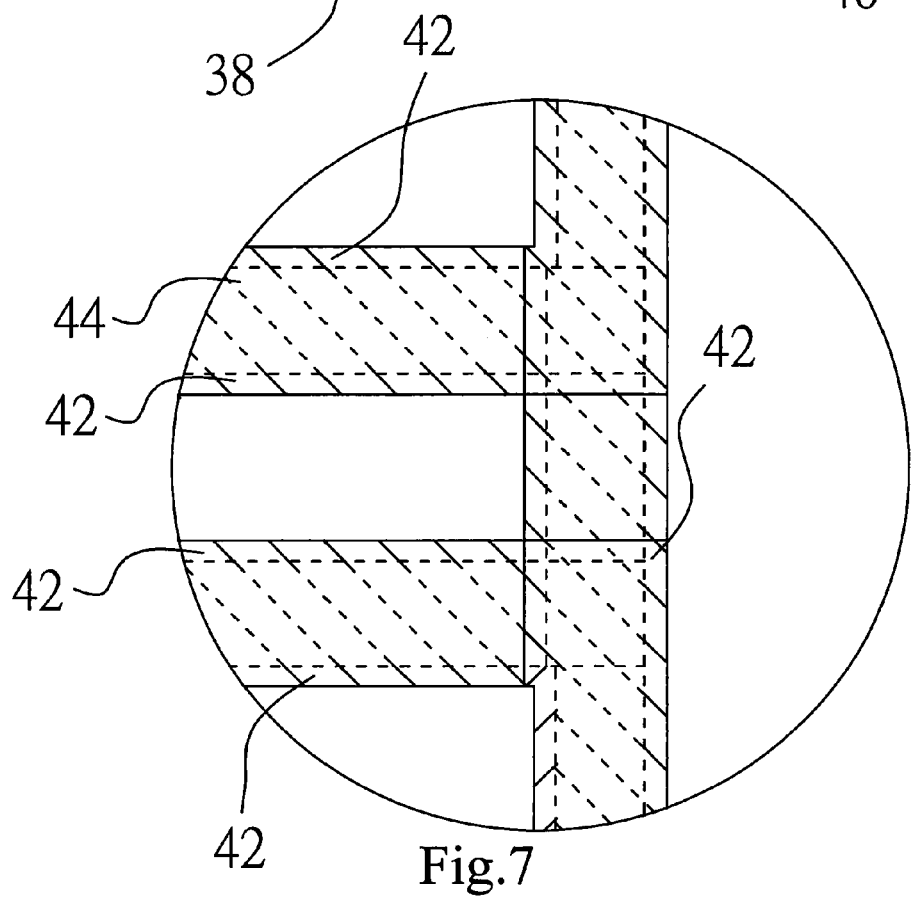
FIG. 7 is a partial enlarged view of a storage capacitor in a circuit layout according to a second embodiment of the present invention.

Furthermore, referring to FIG. 6 for a schematic diagram of a circuit layout used for pixel electrode of an LCD panel according to a second embodiment of the present invention, wherein, the □-shaped slanted-line portion indicates a storage capacitor 38, which is connected to a thin-film-transistor 40. Furthermore, referring to FIG. 7 for a partial enlarged view of the dotted line circle portion of a storage capacitor as shown in FIG. 6. Wherein, the solid line portion indicates the portion of a removed storage capacitor 42 upon the completion of a storage capacitor through utilizing the present invention, while the dotted line portion indicates the portion of a remaining storage capacitor 44.

Figure 8:
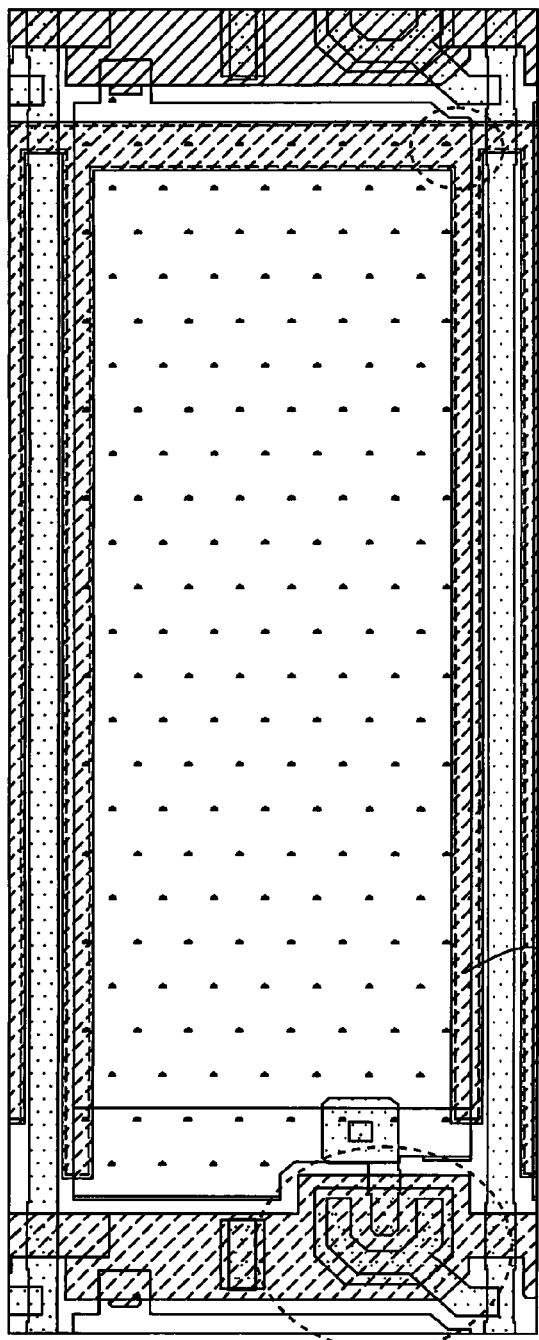
FIG. 8 is a schematic diagram of a circuit layout used for a pixel electrode of an LCD panel according to a third embodiment of the present invention.
Figure 9:
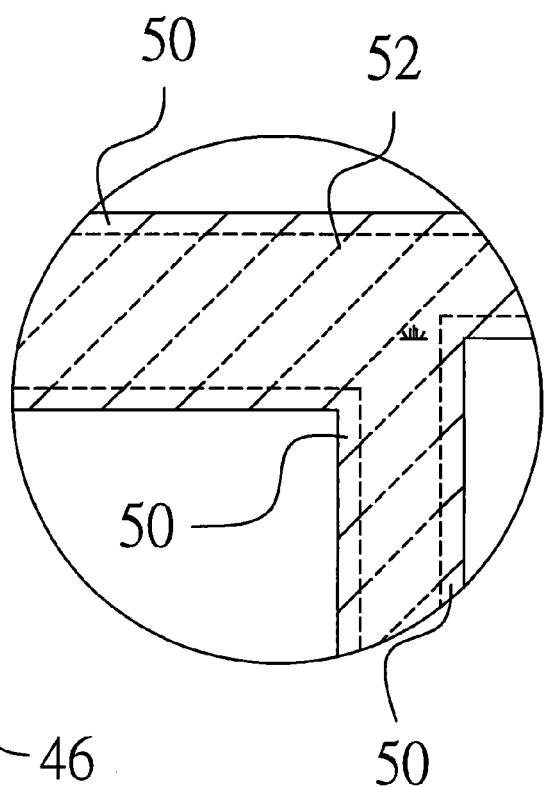
FIG. 9 is a partial enlarged view of a storage capacitor in a circuit layout according to a third embodiment of the present invention.

Finally, referring to FIG. 8 for a schematic diagram of a circuit layout used for pixel electrode of an LCD panel according to a third embodiment of the present invention, wherein, the ⊓-shaped slanted-line portion indicates a storage capacitor 46, which is connected to a thin-film-transistor 48. Furthermore, referring to FIG. 9 for a partial enlarged view of the dotted line circle portion of a storage capacitor as shown in FIG. 8. Wherein, the solid line portion indicates the portion of a removed storage capacitor 50 upon the completion of a storage capacitor through utilizing the present invention, while the dotted line portion indicates the portion of a remaining storage capacitor 52.

Summing up the above, in the present invention, the exposure to light of photoresist layer is performed through a diffraction phenomenon created by the patterns of a mask, so as to produce a storage capacitor having thinner dielectric layer, thus being capable of reducing the area of an electrode layer, increasing aperture ratio of a storage capacitor, while maintaining sufficient capacitance.

The above detailed description of the preferred embodiment is intended to describe more clearly the characteristics and spirit of the present invention. However, the preferred embodiments disclosed above is not intended to be any restrictions to the scope of the present invention. Conversely, its purpose is to include the various changes and equivalent arrangements which are within the scope of the appended claims.

What is claimed is:

1. A storage capacitor having an increased aperture ratio, which is formed with a thin-film-transistor simultaneously, comprising:
   a substrate;
   a metal layer formed on said substrate;
   a first dielectric layer covered on said metal layer;
   a second dielectric layer covered on said first dielectric layer, wherein said second dielectric layer includes a portion correspondingly disposed over said metal layer that a thickness of said portion is less than another thickness of other remaining portions of said second dielectric layer, a distance from the substrate to a top of the portion is greater than a distance from the substrate to a top of the remaining portions; and
   an electrode layer disposed on said second dielectric layer, wherein an area of said electrode layer is reduced proportionally to a reduction of said thickness of said portion while keeping a capacitance of said storage capacitor constant,
   wherein said first dielectric layer and said second dielectric layer are made of silicon nitride.

2. The storage capacitor having an increased aperture ratio according to claim 1, wherein
   said electrode layer is a transparent conductive electrode layer.

3. The storage capacitor having an increased aperture ratio according to claim 2, wherein
   said transparent conductive electrode layer is made of indium-tin-oxide (ITO).

4. The storage capacitor having an increased aperture ratio according to claim 1, wherein
   said substrate is a glass substrate.

5. The storage capacitor having an increased aperture ratio according to claim 1, wherein the first dielectric layer extends over both the metal layer and the substrate and has a uniform thickness.

* * * * *